US007705652B2

(12) United States Patent
Jang

(10) Patent No.: US 7,705,652 B2
(45) Date of Patent: Apr. 27, 2010

(54) CLOCK GENERATING APPARATUS AND CLOCK GENERATING METHOD

(75) Inventor: Kyungwoon Jang, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 12/013,553

(22) Filed: Jan. 14, 2008

(65) Prior Publication Data

US 2008/0175342 A1    Jul. 24, 2008

(30) Foreign Application Priority Data

Jan. 16, 2007    (JP)    ............... 2007-007225

(51) Int. Cl.
*H03K 3/00*    (2006.01)
(52) U.S. Cl. .................... 327/299; 327/155; 327/160; 327/162
(58) Field of Classification Search ................ 327/141, 327/144–147, 150, 151, 155, 156, 159, 160, 327/162, 291, 292, 299
See application file for complete search history.

(56) References Cited

U.S. PATENT DOCUMENTS 4,101,838 A * 7/1978 Aihara et al. ............... 327/115

| | | | |
|---|---|---|---|
| 6,294,938 B1 * | 9/2001 | Coddington et al. ........ 327/158 |
| 6,456,164 B1 * | 9/2002 | Fan .............................. 331/16 |
| 6,700,945 B2 * | 3/2004 | Maeda ....................... 375/376 |
| 7,039,114 B2 | 5/2006 | Honmura et al. |
| 2006/0034337 A1 | 2/2006 | Ryu et al. |
| 2006/0092983 A1 | 5/2006 | Kataoka et al. |

FOREIGN PATENT DOCUMENTS

JP    2003087229    3/2003
JP    2006-134390    5/2006

* cited by examiner

*Primary Examiner*—Lincoln Donovan
*Assistant Examiner*—William Hernandez
(74) *Attorney, Agent, or Firm*—Turocy & Watson, LLP

(57) ABSTRACT

A clock generating apparatus has an integral ratio divider for, according to frequency-dividing parameters for generating a second clock signal including a second frequency by using a first clock signal including a first frequency, outputting the second clock signal, and a frequency-dividing parameter generating portion for comparing program clock reference inputted from outside with an STC value based on the second clock signal and outputting the frequency-dividing parameters so as to converge a discrepancy between the program clock reference and the STC value within a predetermined range, and wherein the frequency-dividing parameter generating portion generates new frequency-dividing parameters each time the program clock reference is inputted from outside.

8 Claims, 3 Drawing Sheets

CLOCK GENERATING APPARATUS AND CLOCK GENERATING METHOD

CROSS REFERENCE TO RELATED APPLICATIONS

This application is based upon and claims the benefit of priority from the prior Japanese Patent Application No. 2007-7225, filed on Jan. 16, 2007, the entire contents of which are incorporated herein by reference.

BACKGROUND OF THE INVENTION

The present invention relates to a clock generating apparatus and a clock generating method suited to STC control necessary to an MPEG-2 TS System.

The MPEG-2 System defines a system for multiplexing individual streams such as an arbitrary number of encoded video, voice and additional data and reproducing them with each of them in synchronization. The MPEG-2 System defines two kinds of system in order to support a wide range of applications.

One is a program stream (PS), where one program is configured in one stream. The program stream is intended to be applied to transmission and accumulation of data in an environment where no error occurs. As the program stream can reduce redundancy, it is used for a digital storage medium using a strong error-correcting code, such as a DVD.

The other is a transport stream (TS), where multiple programs can be configured in one stream so that it can support digital broadcasting and the like. The transport stream is intended to be applied to an environment where a data transmission error occurs such as broadcasting or communication network. It has greater redundancy than the program stream.

The MPEG-2 TS System has MPEG-2 encoded video signals, voice signals, additional data, control signals and the like stored in transport stream packets (hereinafter referred to as TS packets) of 188 bytes.

In the MPEG-2 TS System, a transmitter (encoder) transmits a TS packet including program clock reference (hereinafter referred to as PCR) at regular time intervals in order to eliminate a difference in operation speed between the transmitter and a receiver (decoder) due to mutual clock deviation. The PCR is a value having a predetermined bit number (unit of 42 bit: 27 MHz).

Conventionally, the receiver compares the PCR included in a received TS packet with time information (a value counted on the receiver side, which is a count value assuming 27 MHz in advance on initialization) of a system time clock (hereinafter referred to as STC) for decoding an MPEG-2 encoded signal so as to increase or decrease voltage of a voltage controlled crystal oscillator (VCXO) used to generate the STC. To be more specific, the receiver adjusts and synchronizes the STC based on the PCR (refer to Patent Document 1 for instance).

Furthermore, an audio master clock in synchronization with the STC is generated by using the STC outputted from the VCXO so as to perform decode processing of audio (refer to Patent Document 2 for instance).

However, there has been a problem that the VCXO which is essential in generating the STC is an outside part leading to increase in cost and increase in packaging area.

[Patent Document 1] Japanese Patent Laid-Open No. 2006-134390

[Patent Document 2] Japanese Patent Laid-Open No. 2003-87229

SUMMARY OF THE INVENTION

According to one aspect of the present invention, there is provided a clock generating apparatus comprising:

an integral ratio divider for, according to frequency-dividing parameters for generating a second clock signal including a second frequency by using a first clock signal including a first frequency, outputting the second clock signal; and a frequency-dividing parameter generating portion for comparing program clock reference inputted from outside with an STC value based on the second clock signal and outputting the frequency-dividing parameters so as to converge a discrepancy between the program clock reference and the STC value within a predetermined range, and wherein:

the frequency-dividing parameter generating portion generates new frequency-dividing parameters each time the program clock reference is inputted from outside.

According to one aspect of the present invention, there is provided a clock generating apparatus comprising:

an integral ratio divider for, provided with a first clock signal of a first frequency and frequency-dividing parameters, outputting a second clock signal of a second frequency by combining P (P is an integer of 1 or more) frequency dividing of the first clock signal with P+1 frequency dividing at a ratio based on the frequency-dividing parameters;

a counter for having the second clock signal inputted and generating and outputting a count value based on the second clock signal;

a subtracter for, provided with a PCR value included in program clock reference and the count value, calculating a difference between the PCR value and an STC value based on the count value and outputting it as a difference value;

a frequency-dividing parameter generating portion for having the difference value, a previous difference value which is the difference value outputted from the subtracter last time and previous frequency-dividing parameters which are the frequency-dividing parameters outputted last time inputted, comparing the difference value with the previous difference value and adjusting the previous frequency-dividing parameters based on a comparison result so as to output the frequency-dividing parameters; and a storage portion for storing the difference value outputted from the subtracter and the frequency-dividing parameters outputted from the frequency-dividing parameter generating portion and outputting them as the previous difference value and the previous frequency-dividing parameters after a predetermined time, and wherein:

the difference value is converged within a predetermined range.

According to one aspect of the present invention, there is provided a clock generating method comprising:

generating and outputting a second clock signal including a second frequency by combining P (P is an integer of 1 or more) frequency dividing and P+1 frequency dividing of a first clock signal including a first frequency at a ratio based on frequency-dividing parameters;

counting the second clock signal and outputting a count value;

calculating a difference between a PCR value included in program clock reference and an STC value based on the count value and outputting a difference value; and generating and outputting the frequency-dividing parameters based on transition of the difference value.

DESCRIPTION OF THE EMBODIMENTS

Hereafter, an embodiment of the present invention will be described based on the drawings.

Figure 1:
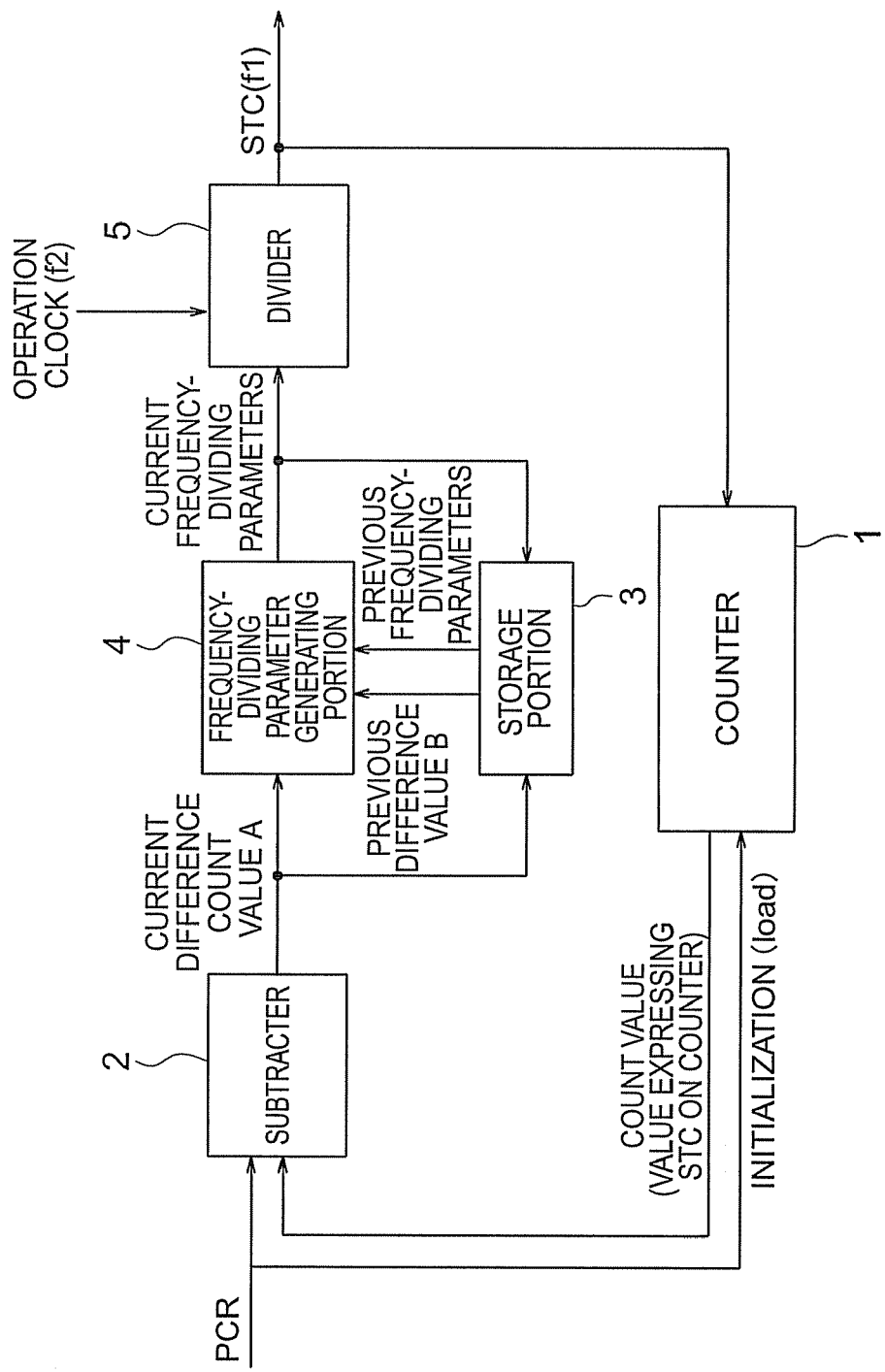
FIG. 1 is a diagram showing a skeleton framework of a clock generating apparatus according to an embodiment of the present invention.

FIG. 1 shows a skeleton framework of a clock generating apparatus according to an embodiment of the present invention. The clock generating apparatus according to this embodiment includes a counter 1, a subtracter 2, a storage portion 3, a frequency-dividing parameter generating portion 4 and an integral ratio divider 5, and generates an STC (System Clock) of a receiver of the MPEG-2 System.

The STC is a clock (time information) necessary to decode an MPEG-2-encoded signal. Apart from the STC, the clock generating apparatus according to this embodiment includes an operation clock for operating the integral ratio divider 5.

The operation clock is a first operation clock including a predetermined first frequency (f2). The STC is a second operation clock including a second frequency (f1) generated from the first operation clock and frequency-dividing parameters (by the integral ratio divider 5).

The counter 1 counts the STC outputted from the integral ratio divider 5 and outputs it as a count value (by expressing the STC on the counter). The counter 1 loads the value of program clock reference (PCR) included in a TS packet received by the receiver on initialization of the counter 1.

The subtracter 2 has the PCR and the value expressing STC on the counter (count value) inputted thereto, and calculates a difference between them (PCR−STC value). Here, the PCR is a value expressed in units of 27 MHz. Therefore, the counted STC value is also the STC value converted to the units of 27 MHz when calculating the difference. The difference is hereafter referred to as a current difference value.

Whenever calculating the current difference value, the subtracter 2 compares an absolute value of the current difference value with an error determination value which is set up in the receiver from outside in advance so as to output the current difference value if it is equal to or smaller than the error determination value.

In the case where the absolute value of the current difference value is larger than the error determination value, the difference value is so large that it is difficult to control the STC to synchronize to the PCR. Thus, it is determined to be an error, and the count value of the counter 1 is reset by using the PCR received next. The error determination value is an arbitrary value which is experimentally or empirically determined.

The storage portion 3 has the difference value (hereinafter referred to as a previous difference value) and the frequency-dividing parameters (hereinafter referred to as previous frequency-dividing parameters) on receiving the PCR last time stored therein. The previous difference value and the previous frequency-dividing parameters are not set up on the initialization of the storage portion 3.

The frequency-dividing parameter generating portion 4 is provided with the current difference value outputted from the subtracter 2 as well as the previous difference value and the previous frequency-dividing parameters stored in the storage portion 3. The frequency-dividing parameter generating portion 4 compares the current difference value with the previous difference value, and adjusts the previous frequency-dividing parameters based on a comparison result so as to output them as the current frequency-dividing parameters.

The current frequency-dividing parameters are stored in the storage portion 3, and are used as the previous frequency-dividing parameters when generating and outputting the frequency-dividing parameters next. The frequency-dividing parameters indicate the number of times of output per unit time as to each of the clocks different in frequency-dividing ratio (to be more specific, different in frequency).

The integral ratio divider 5 is provided with the current frequency-dividing parameters and the operation clock of the receiver, and frequency-divides the operation clock based on the current frequency-dividing parameters (frequency-dividing ratio) so as to generate and output the STC. The operation clock is the operation clock of the receiver.

Here, the frequency of the outputted STC is f1, and the frequency of the provided operation clock is f2. In the case where f2/f1 is indivisible, f1 is generated by using a heretofore known method, such as combining a frequency wherein f2 is frequency-divided by x with a frequency wherein f2 is frequency-divided by y.

The heretofore known method which will be described below is used when setting initial values of the frequency-dividing parameters described below. Only f2 and the frequency-dividing parameters are used on STC control.

The heretofore known method is the following procedure. First, x is the largest natural number that satisfies f2/f1>x, and y is the smallest natural number that satisfies f2/f1<y. Next, natural numbers P and Q which make f1:f2=P:Q are acquired. Next, natural numbers a and b which simultaneously satisfy Q=a×x+b×y and P=a+b are acquired. And f1 is generated in a pattern in which x frequency-dividing output of f2 is outputted a times and y frequency-dividing output of f2 is outputted b times.

The above a and b are the frequency-dividing parameters. To be more specific, according to this embodiment, the frequency-dividing parameters are the values which indicate the number of times of output per unit time of the frequency wherein f2 is frequency-divided by x and the number of times of output per unit time of the frequency wherein f2 is frequency-divided by y.

For instance, in the case where the frequency f1 of the outputted STC is 27 MHz and the frequency f2 of the provided operation clock is 150 MHz, it makes f2/f1=5.55 . . . with x=5 and y=6. To be more specific, 27 MHz is generated by combining a frequency 30 MHz wherein f2 is frequency-divided by 5 with a frequency 25 MHz wherein f2 is frequency-divided by 6. Next, the natural numbers P and Q which make f1:f2=P:Q are acquired. Here, P=9 and Q=50. Next, the natural numbers a and b which simultaneously satisfy Q=a×x+b×y and P=a+b are acquired. Here, a=4 and b=5.

In this case, based on the above, the ratio of the number of times of output is 4:5 regarding 5 frequency dividing (30 MHz) and 6 frequency dividing (25 MHz). As it makes 5×4/(4+5)+6×5/(4+5)=5.55 . . . , the frequency-dividing ratio f2/f1=5.55 . . . can be realized.

Furthermore, according to this embodiment, the frequency-dividing parameter generating portion 4 sets the frequency-dividing parameters at values of which changeable range is wide so that the frequency-dividing ratio can be fine-tuned. For instance, in the case where the changeable range of the frequency-dividing parameters is 0 to 255 (8 bits), it is set at 5 frequency dividing=200 and 6 frequency dividing=250. It is naturally 5×200/(200+250)+6×250/(200+ 250)=5.55 . . . . An operation clock frequency f2 to be provided to the integral ratio divider 5 and an STC frequency f1 to be outputted are predetermined, and 5 frequency dividing=200 and 6 frequency dividing=250 are initial frequency-dividing parameters.

The frequency-dividing parameter generating portion 4 adjusts the previous frequency-dividing parameters based on the comparison between the current difference value and the previous difference value, and outputs them as the current frequency-dividing parameters so that the STC synchronized to the PCR can be outputted.

First, in the case where the PCR is larger than the STC value, it indicates that the clock used for transmission on the transmitter side is earlier than the STC. Therefore, the frequency-dividing parameters are adjusted to render the STC earlier. Inversely, in the case where the PCR is smaller than the STC value, it indicates that the clock used for transmission on the transmitter side is later than the STC. Therefore, the frequency-dividing parameters are adjusted to render the STC later.

Figure 2:
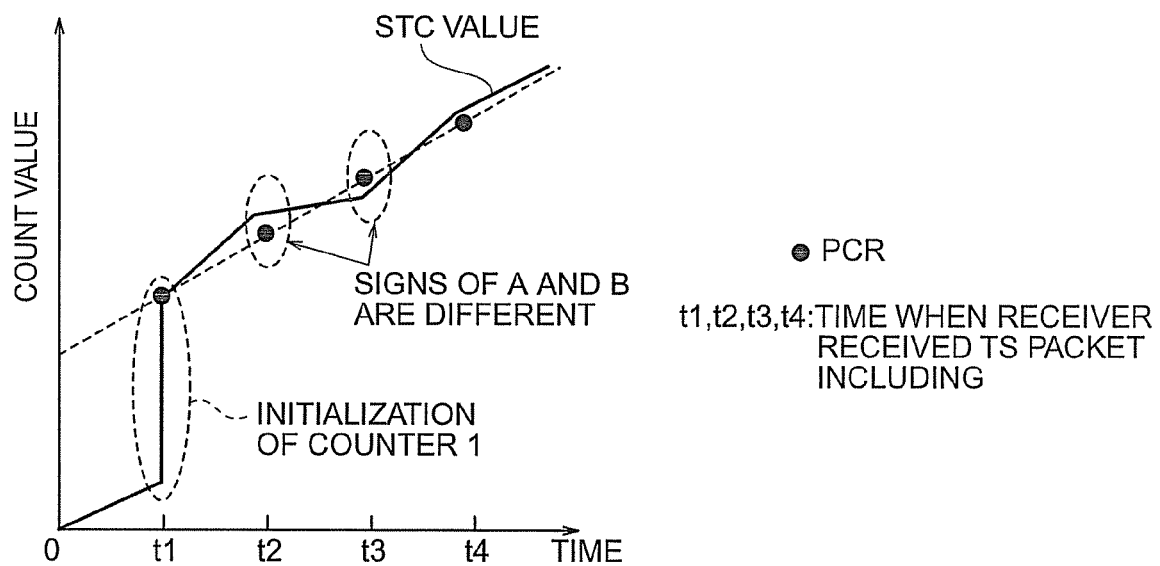
FIG. 2 is a diagram showing convergence situation of PCR and STC values.

The frequency-dividing parameters are adjusted so that the difference between the PCR and the STC value gets closer to zero. In reality, the frequency-dividing parameters are adjusted upon the difference of zero between the PCR and the STC value as shown in FIG. 2.

Figure 3:
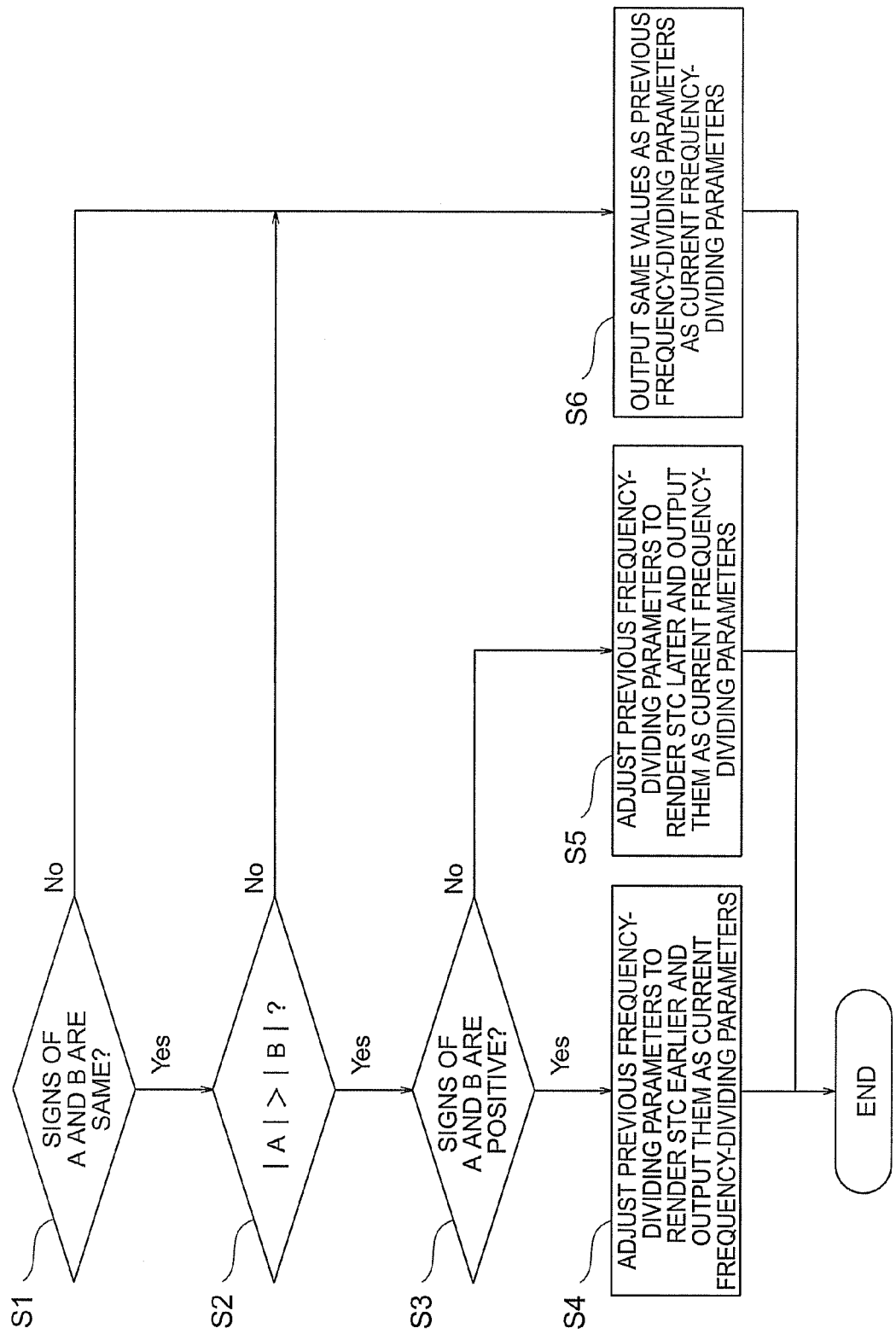
FIG. 3 is a diagram showing a flowchart of frequency-dividing parameter adjustment.

The adjustment of the frequency-dividing parameters will be described by using a flowchart shown in FIG. 3. The current difference value is A, the previous difference value is B, the previous frequency-dividing parameters are X for x frequency dividing and Y for y frequency dividing. As x is the largest natural number that satisfies f2/f1>x, and y is the smallest natural number that satisfies f2/f1<y, y=x+1 holds in the case where f2/f1 is not an integer.

The ratio of the number of times of output per unit time as to x frequency dividing and y frequency dividing is X: Y. Therefore, the frequency-dividing ratio of the clock outputted from the divider is x×X/(X+Y)+y×Y/(X+Y)=x+Y/(X+Y) by assigning y=x+1.

(Step S1) Signs of A and B are compared. If they are the same, it proceeds to a step S2. When the sign is positive, it indicates that the PCR is larger than the STC value. When the sign is negative, it indicates that the PCR is smaller than the STC value.

As previously described, in the case where the PCR is larger than the STC value, the frequency-dividing parameters are adjusted to render the STC earlier. In the case where the PCR is smaller than the STC value, the frequency-dividing parameters are adjusted to render the STC later.

As shown in FIG. 2, when the signs of A and B are different, the difference between the PCR and the STC value does not tend to diverge (the difference gradually increases). Therefore, it can be considered that the STC control is not required, and so it proceeds to a step S6.

(Step S2) The absolute values of A and B are compared. In the case of |A|≦|B|, the difference between the STC value and the PCR is not larger than the last time. Therefore, it is determined that the previous frequency-dividing parameters are appropriate values, and so it proceeds to a step S6.

In the case of |A|>|B|, the difference between the PCR and the STC value tends to diverge (the difference gradually increases). So, it proceeds to a step S3.

(Step S3) In the case where the signs of A and B are positive, it proceeds to a step S4. In the case where the signs of A and B are negative, it proceeds to a step S5.

(Step S4) The PCR is larger than the STC value, and the difference between them is larger than the last time. Therefore, the frequency-dividing parameters are adjusted to render the STC value larger. To be more specific, the previous frequency-dividing parameters X and Y are adjusted to render the frequency f1 of the STC to be outputted earlier (higher as the frequency).

The frequency f1 of the STC outputted from the integral ratio divider 5 is generated with the x frequency dividing and y (=x+1) frequency dividing of the frequency f2 of the operation clock provided to the integral ratio divider 5 as the ratio of the number of times of output per unit time X:Y. To be more specific, f1 is x+Y/(X+Y) frequency dividing of f2. Here, the smaller the frequency-dividing ratio is, the higher the frequency f1 of the STC outputted from the integral ratio divider 5 becomes.

Therefore, to render the frequency f1 of the STC higher, X and Y are adjusted to render the frequency-dividing ratio x+Y/(X+Y) smaller, that is, to render Y/(X+Y) which is a term of the frequency-dividing parameters smaller.

For instance, in the case of X>Y, 1 is added to each of the previous frequency-dividing parameters X and Y. In the case of X<Y, 1 is subtracted from each of the previous frequency-dividing parameters X and Y. And in the case of X=Y, the current frequency-dividing parameters may be the values wherein 1 is added to the previous frequency-dividing parameter X with Y as-is.

Moreover, regardless of magnitude relation between X and Y, the current frequency-dividing parameters may be the values wherein 1 is added to the previous frequency-dividing parameter X with Y as-is. Inversely, the current frequency-dividing parameters may be the values wherein 1 is subtracted from the previous frequency-dividing parameter Y with X as-is.

(Step S5) The PCR is smaller than the STC value, and the difference between them is expanding. Therefore, the frequency-dividing parameters are adjusted to render the STC value smaller. To be more specific, the frequency-dividing parameters are adjusted to render the frequency f1 of the STC value to be outputted later (lower as the frequency). Therefore, X and Y are adjusted to render the frequency-dividing ratio x+Y/(X+Y) larger, that is, Y/(X+Y) which is a term of the frequency-dividing parameters larger.

For instance, in the case of X>Y, 1 is subtracted from each of the previous frequency-dividing parameters X and Y. In the case of X<Y, 1 is added to each of the previous frequency-dividing parameters X and Y. And in the case of X=Y, the current frequency-dividing parameters may be the value wherein 1 is added to Y of the previous frequency-dividing parameters with X as-is.

Moreover, regardless of magnitude relation between X and Y, the current frequency-dividing parameters may be the values wherein 1 is added to Y of the previous frequency-dividing parameters with X as-is. Inversely, the current frequency-dividing parameters may also be the values wherein 1 is subtracted from X of the previous frequency-dividing parameters with Y as-is.

(Step S6) The current frequency-dividing parameters are the same as the previous frequency-dividing parameters.

Thus, each time the PCR is received, the difference from the STC value is calculated. The frequency-dividing parameters are adjusted based on a change in the difference so as to prevent the STC outputted from the clock generating apparatus from deviating from the PCR (control it to converge within a predetermined range). Therefore, synchronization can be established within a certain range between the data transmission side (transmitter) and the receiver of the MPEG-2 System including the clock generating apparatus.

As described above, it is possible, by using the clock generating apparatus according to this embodiment, to control the STC without using an outside part such as a VCXO. Therefore, cost can be reduced. It also allows packaging area to be cut down.

What is claimed is:

1. A clock generating apparatus comprising:
   an integral ratio divider for, provided with a first clock signal of a first frequency and frequency-dividing parameters, outputting a second clock signal of a second frequency by combining P (P is an integer of 1 or more) frequency dividing of the first clock signal with P+1 frequency dividing at a ratio based on the frequency-dividing parameters;
   a counter for having the second clock signal inputted and generating and outputting a count value based on the second clock signal;
   a subtracter for, provided with a program clock reference value included in program clock reference and the count value, calculating a difference between the program clock reference value and an system time check value based on the count value and outputting it as a difference value; and
   a frequency-dividing parameter generating portion for having the difference value, a previous difference value which is the difference value outputted from the subtracter last time and previous frequency-dividing parameters which are the frequency-dividing parameters outputted last time inputted, comparing the difference value with the previous difference value and adjusting the previous frequency-dividing parameters based on a comparison result so as to output the frequency-dividing parameters.

2. The clock generating apparatus according to claim 1, further comprising:
   a storage portion for storing the difference value outputted from the subtracter and the frequency-dividing parameters outputted from the frequency-dividing parameter generating portion and outputting them as the previous difference value and the previous frequency-dividing parameters after a predetermined time.

3. The clock generating apparatus according to claim 1, wherein the difference value is converged within a predetermined range.

4. The clock generating apparatus according to claim 1, wherein the frequency-dividing parameter generating portion outputs the same values as the previous frequency-dividing parameters as the frequency-dividing parameters in the case where a sign of the difference value is the same as the sign of the previous difference value and an absolute value of the difference value is equal to or less than the absolute value of the previous difference value.

5. The clock generating apparatus according to claim 1, wherein the subtracter sets the program clock reference value provided after a predetermined time as a counter value of the counter in the case where the difference value is larger than a predetermined error determination value.

6. A clock generating method comprising:
   generating and outputting a second clock signal including a second frequency by combining P (P is an integer of 1 or more) frequency dividing and P+1 frequency dividing of a first clock signal including a first frequency at a ratio based on frequency-dividing parameters;
   counting the second clock signal and outputting a count value;
   calculating a difference between a program clock reference value included in program clock reference and a system time check value based on the count value and outputting a difference value; and
   generating and outputting the frequency-dividing parameters based on transition of the difference value.

7. The clock generating method according to claim 6, wherein the difference value is converged within a predetermined range.

8. A clock generating apparatus comprising:
   an integral ratio divider for, provided with a first clock signal of a first frequency and frequency-dividing parameters, outputting a second clock signal of a second frequency by combining P (P is an integer of 1 or more) frequency dividing of the first clock signal with P+1 frequency dividing at a ratio based on the frequency-dividing parameters;
   a counter for having the second clock signal inputted and generating and outputting a count value based on the second clock signal;
   a subtracter for, provided with base time information and the count value, calculating a difference between the base time information and the count value; and
   a frequency-dividing parameter generating portion for having the difference value, a previous difference value which is the difference value outputted from the subtracter last time and previous frequency-dividing parameters which are the frequency-dividing parameters outputted last time inputted, comparing the difference value with the previous difference value and adjusting the previous frequency-dividing parameters based on a comparison result so as to output the frequency-dividing parameters.

* * * * *